(12) United States Patent
Jun et al.

(10) Patent No.: US 10,848,074 B2
(45) Date of Patent: Nov. 24, 2020

(54) HIGH VOLTAGE BRIDGE RECTIFIER

(71) Applicant: Electronics and Telecommunications Research Institute, Daejeon (KR)

(72) Inventors: Chi Hoon Jun, Daejeon (KR); Sang Choon Ko, Daejeon (KR); Dong Yun Jung, Daejeon (KR); Jong-Moon Park, Daejeon (KR); Hyun-Gyu Jang, Sejong-si (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/567,362

(22) Filed: Sep. 11, 2019

(65) Prior Publication Data
US 2020/0119654 A1 Apr. 16, 2020

(30) Foreign Application Priority Data

Oct. 12, 2018 (KR) .................. 10-2018-0122113
May 23, 2019 (KR) .................. 10-2019-0060451

(51) Int. Cl.
| | | |
|---|---|---|
| *H02M 7/00* | (2006.01) | |
| *H02M 7/219* | (2006.01) | |
| *H05K 1/18* | (2006.01) | |
| *H05K 1/11* | (2006.01) | |
| *H05K 1/02* | (2006.01) | |

(52) U.S. Cl.
CPC ........... *H02M 7/003* (2013.01); *H02M 7/219* (2013.01); *H05K 1/0254* (2013.01); *H05K 1/111* (2013.01); *H05K 1/181* (2013.01); *H05K 2201/10166* (2013.01); *H05K 2201/10174* (2013.01)

(58) Field of Classification Search
CPC ........ H02M 7/003; H02M 7/04; H02M 7/219; H05K 1/0254; H05K 1/111; H05K 1/181; H05K 2201/10166; H05K 2201/10174
See application file for complete search history.

(56) References Cited

U.S. PATENT DOCUMENTS

| | | | |
|---|---|---|---|
| 6,043,970 A | 3/2000 | Song et al. | |
| 8,790,965 B2 | 7/2014 | Cheah et al. | |
| 8,963,338 B2 | 2/2015 | Lin et al. | |
| 9,711,939 B2 | 7/2017 | Lee et al. | |
| 2011/0222285 A1* | 9/2011 | Ye .......................... | H05B 45/40 |
| | | | 362/249.02 |
| 2016/0113112 A1* | 4/2016 | Oya ..................... | H05K 1/0296 |
| | | | 361/783 |
| 2017/0345792 A1* | 11/2017 | Tanimoto ................ | H01L 24/49 |
| 2018/0047714 A1* | 2/2018 | Feng ................... | H01L 23/3675 |
| 2019/0006954 A1 | 1/2019 | Hwang | |

OTHER PUBLICATIONS

Aitor Vázquez, et al., "On the Use of Front-End Cascode Rectifiers Based on Normally on SiC JFET and Si MOSFET", IEEE Transactions on Power Electronics, vol. 29, No. 5, pp. 2418-2427, May 2014.

* cited by examiner

*Primary Examiner* — Angel Roman
(74) *Attorney, Agent, or Firm* — Rabin & Berdo, P.C.

(57) ABSTRACT

Provided is a high voltage bridge rectifier. The high voltage bridge rectifier includes a supporter, a substrate on the supporter, a plurality of equivalent diode circuits mounted on the substrate, interconnection lines, and terminals. The substrate may include an insulation layer, element pads disposed on a center of the insulation layer, and terminal pads disposed on an edge of the insulation layer to surround the element pads.

14 Claims, 17 Drawing Sheets

HIGH VOLTAGE BRIDGE RECTIFIER

CROSS-REFERENCE TO RELATED APPLICATIONS

This U.S. non-provisional patent application claims priority under 35 U.S.C. § 119 of Korean Patent Application Nos. 10-2018-0122113, filed on Oct. 12, 2018, and 10-2019-0060451, filed on May 23, 2019, the entire contents of which are hereby incorporated by reference.

BACKGROUND

The present disclosure herein relates to an electronic device, and more particularly, to a high voltage bridge rectifier.

Recently, the use of electric power conversion devices has been rapidly increasing due to the development of electric vehicles and telecommunication systems. Such a power conversion device may convert an AC power into a DC power. For example, the power conversion device may include a bridge diode rectifier. The bridge diode rectifier may include silicon semiconductor or compound semiconductor-based diodes. In general, the silicon semiconductor-based diodes are being used for low power conversion, and the compound semiconductor-based diodes are being used for high power conversion.

SUMMARY

The present disclosure provides a high voltage bridge rectifier that is capable of minimizing parasitic inductance and surge current, has a small size, and have a function of high voltage rectification conversion.

An embodiment of the inventive concept provides a high voltage bridge rectifier. The high voltage bridge rectifier includes: a supporter: a substrate on the supporter: and a plurality of equivalent diode circuits mounted on the substrate. the substrate includes: an insulation layer; element pads disposed on a center of the insulation layer and under the plurality of equivalent diode circuits; and terminal pads disposed on an edge of the insulation layer and surrounding the element pads.

In an embodiment, each of the plurality of equivalent diode circuits may include: a diode; and a high voltage normally-on type transistor including a source connected to a cathode of the low voltage diode, a gate connected to an anode of the low voltage diode, and a drain connected in series to the source.

In an embodiment, each of the plurality of equivalent diode circuits may serve as a high voltage diode circuit.

In an embodiment, the high voltage bridge rectifier may further include interconnection lines configured to electrically connect the diode, the transistor, the element pads, and the terminal pads to each other.

In an embodiment, each of the element pads may include: a diode pad on which the low voltage diode is mounted; and a transistor pad on which the high voltage normally-on type transistor is mounted.

In an embodiment, the terminal pads may include: DC terminal pads disposed to be spaced apart from each other on the insulation layer in a first direction; and AC terminal pads disposed to be spaced apart from each other on the insulation layer in a second direction crossing the first direction.

In an embodiment, the DC terminal pads may include: a cathode terminal pad disposed at one side in the first direction; and an anode terminal pad disposed on the other side in the first direction.

In an embodiment, the high voltage bridge rectifier may further include a capacitor electrode disposed within the insulation layer and aligned with the cathode and anode terminal pads.

In an embodiment, each of the cathode terminal pad and the anode terminal pad may have an "I" shape, and the capacitor electrode may have an "H" shape.

In an embodiment, each of the cathode terminal pad and the anode terminal pad may have an "L" shape, and the capacitor electrode may have an "⊏" shape.

In an embodiment, the high voltage bridge rectifier may further include a contact electrode configured to selectively connect the capacitor electrode to one of the cathode terminal pad and the anode terminal pad.

In an embodiment, the AC terminal pads may include: a first AC terminal pad disposed at one side in the second direction; and a second AC terminal pad disposed at the other side in the second direction.

In an embodiment, the high voltage bridge rectifier may further include a capacitor electrode disposed within the insulation layer and aligned with the first and second AC terminal pads.

In an embodiment, each of the first AC terminal pad and the second AC terminal pad may have a "T" shape, and the capacitor electrode may have an "H" shape.

In an embodiment, each of the first AC terminal pad and the second AC terminal pad may have an "L" shape, and the capacitor electrode may have a "T" shape.

In an embodiment, the high voltage bridge rectifier may further include a contact electrode configured to selectively connect the capacitor electrode to one of the first AC terminal pad and the second AC terminal pad.

In an embodiment, the high voltage bridge rectifier may further include a molding layer on the substrate and the plurality of equivalent diode circuits, wherein the molding layer may selectively expose a bottom surface of the supporter.

In an embodiment, the molding layer may be disposed a bottom surface of the supporter.

In an embodiment, the high voltage bridge rectifier may further include a molding case configured to surround the molding layer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
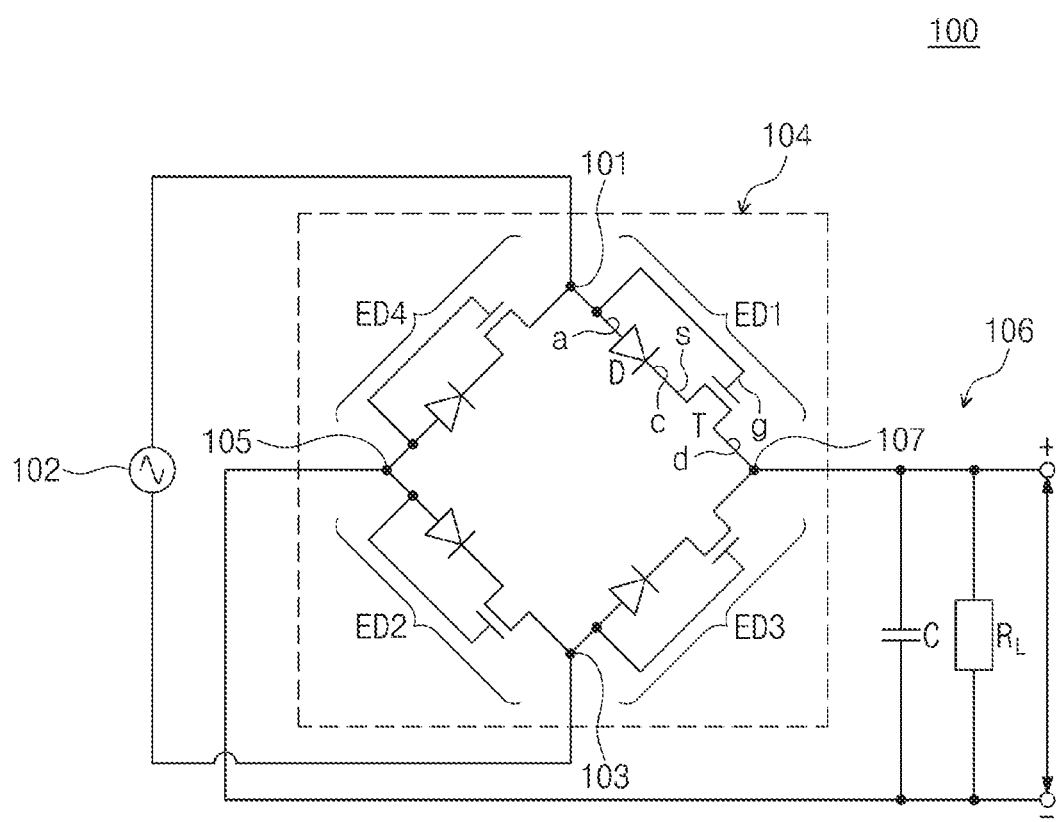
FIG. 1 is a circuit diagram of a power conversion device according to the inventive concept.

Preferred embodiments of the present invention will be described below in detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art, and the present invention is only defined by the scope of the claims. Like reference numerals refer to like elements throughout.

In the following description, the technical terms are used only for explaining a specific exemplary embodiment while not limiting the present invention. In this specification, the terms of a singular form may comprise plural forms unless specifically mentioned. The meaning of 'comprises' and/or 'comprising' specifies a component, an operation and/or an element does not exclude other components, operations and/or elements. Since preferred embodiments are provided below, the order of the reference numerals given in the description is not limited thereto.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes.

FIG. 1 is a circuit diagram of a power conversion device 100 according to the inventive concept.

Referring to FIG. 1, the power conversion device 100 according to the inventive concept may be a high voltage bridge rectifier. For example, the power conversion device 100 according to the inventive concept may include a high voltage AC power source 102, a high voltage bridge rectifier 104, and a full-wave rectification circuit 106.

The high voltage AC power source 102 may supply high voltage AC power. For example, the high voltage AC power source 102 may supply high voltage AC power of about 100 V to about 1,000 V.

The high voltage bridge rectifier 104 may be connected to the high voltage AC power source 102 and the full-wave rectification circuit 106. The high voltage bridge rectifier 104 may rectify the high voltage AC power to DC power. For example, the high voltage bridge rectifier 104 may include first to fourth equivalent diode circuits ED1, ED2, ED3, and ED4. For example, the first equivalent diode circuit ED1 may be connected in series between a first AC node 101 and an anode 107. The second equivalent diode circuit ED2 may be connected in series between a cathode 105 and a second AC node 103. The third equivalent diode circuit ED3 may be connected in series between the second AC node 103 and the anode 107. The fourth equivalent diode circuit ED4 may be connected in series between the cathode 105 and the first AC node 101. Each of the first to fourth equivalent diode circuits ED1, ED2, ED3, and ED4 may include a diode D and a transistor T. The diode D may be a low voltage diode chip. The diode D may include a silicon semiconductor or a compound semiconductor. The transistor T may be a high voltage normally-on type transistor T. A source s of the transistor T may be connected to a cathode c of the diode D, a gate g of the transistor T may be connected to an anode a of the diode D, and a drain d of the transistor T may be connected in series to the source s. For example, the transistor T may be a field effect transistor (FET), a junction gate field effect transistor (JFET), or a high electron mobility transistor (HEMT). The transistor T may include a silicon semiconductor or a compound semiconductor. For example, the transistor T may have a semiconductor material having a wide bandgap such as SiC, GaN, $Ga_2O_3$, or AlN.

The full-wave rectification circuit 106 may be connected to output terminals of the high voltage bridge rectifier 104, for example, the cathode 105 and the anode 107. The full-wave rectification circuit 106 may include a capacitor C and a load resistor $R_L$. The capacitor C and the load resistor $R_L$ may be connected in parallel to the cathode 105 and the anode 107. The capacitor C may smooth out a rectified output waveform or minimize or remove an electromagnetic interference (EMI) induced by the load resistor $R_L$. The load resistor $R_L$ may be a resistance element. On the other hand, the load resistor $R_L$ may be an electronic element.

Figure 2:
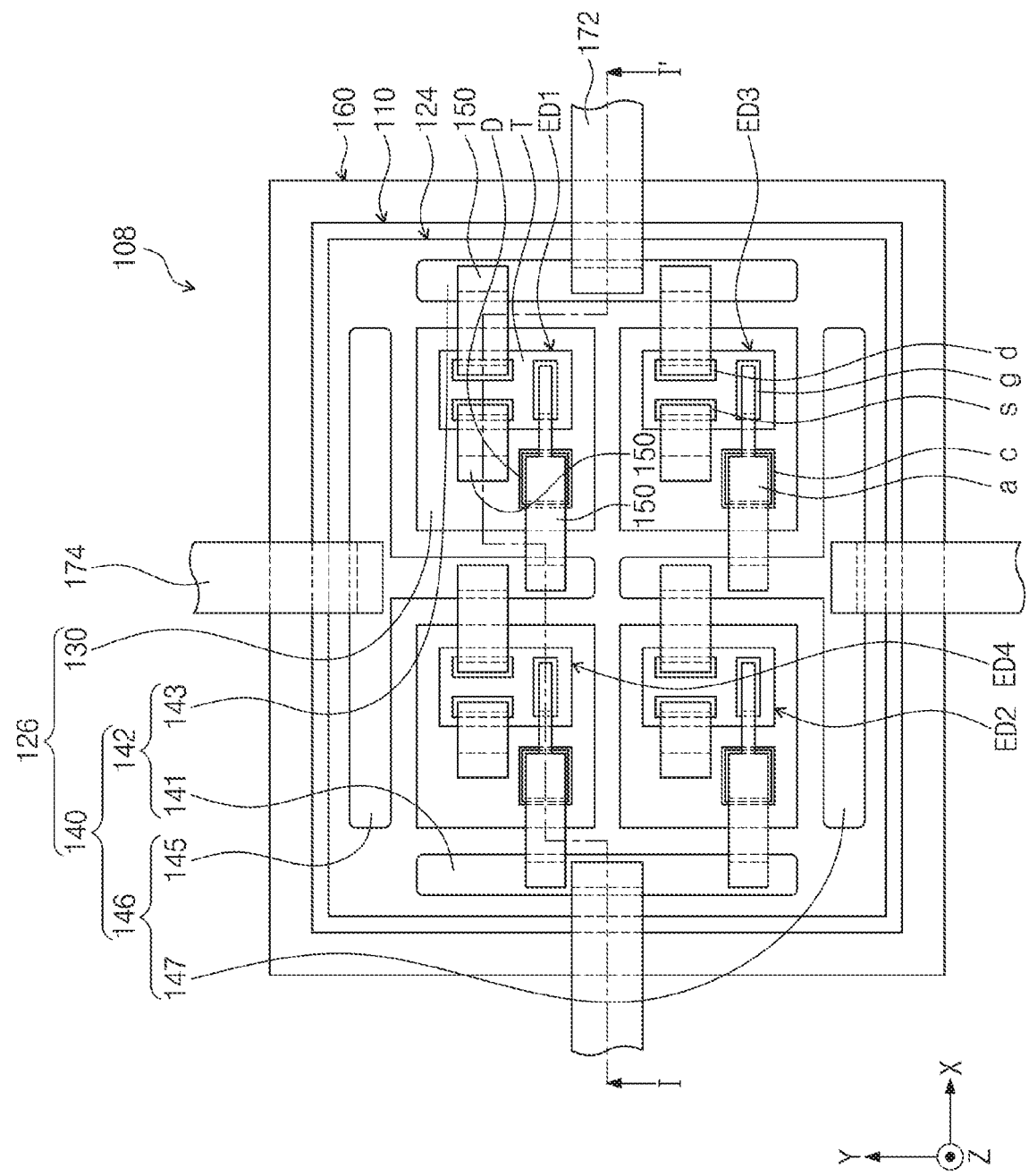
FIG. 2 is a plan view illustrating an example of a package of a high voltage bridge rectifier of FIG. 1.
Figure 3:
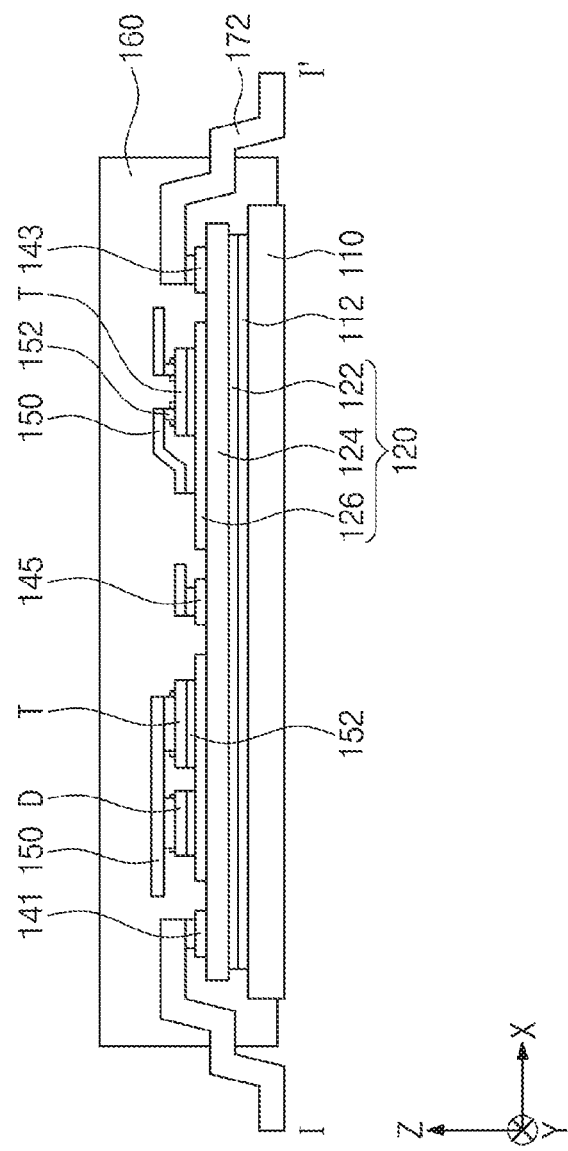
FIG. 3 is a cross-sectional view taken along line I-I' of FIG. 2.

FIG. 2 is a plan view illustrating an example of the package 108 of the high voltage bridge rectifier 104 of FIG. 1. FIG. 3 is a cross-sectional view taken along line I-I' of FIG. 2.

Referring to FIGS. 2 and 3, the package 108 of the high voltage bridge rectifier 104 may include a supporter 110, a substrate 120, first to fourth equivalent diode circuits ED1, ED2, ED3, and ED4, interconnection lines 150, terminals 172 and 174, and a molding layer 160.

The supporter 110 may include a metal plate. The supporter 110 may have a rectangular shape. The supporter 110 may dissipate heat of the first to fourth equivalent diode circuits ED1, ED2, ED3, and ED4 to the outside. On the other hand, the supporter 110 may include an inorganic material such as ceramic or an organic material such as plastic.

The substrate 120 may be disposed on the supporter 110. The substrate 120 may be fixed to the supporter 110 by an adhesion layer 112. The adhesion layer 112 may include solder, preform, or epoxy. For example, the substrate 120 may be a direct bonded copper (DBC) substrate, a direct plated copper (DPC) substrate, a thin plated copper (TPC) substrate, an active metal brazing (AMB) substrate, a low-temperature co-fired ceramic (LTCC) substrate, or a high-temperature co-fired ceramic (HTCC) substrate. For example, the substrate 120 may include a lower conductive layer 122, an insulation layer 124, and pads 126.

The lower conductive layer 122 may be disposed between the adhesion layer 112 and the insulation layer 124. For example, the lower conductive layer 122 may include at least one of metal materials such as copper (Cu), aluminum (Al), silver (Ag), gold (Au), nickel (Ni), and the like.

The insulation layer 124 may be disposed between the lower conductive layer 122 and the pads 126. The insulation layer 124 may electrically insulate the pads 126 from the lower conductive layer 122. The insulation layer may include ceramic such as AlN, $Al_2O_3$, or $Si_3N_4$, and the like. On the other hand, the insulation layer 124 may include an inorganic material except for ceramic or an organic material such as plastic.

The pads 126 may be disposed on the insulation layer 124. For example, the pads 126 may include at least one of metal materials such as copper (Cu), aluminum (Al), silver (Ag), gold (Au), nickel (Ni), and the like.

The pads 126 may be connected to the first to fourth equivalent diode circuits ED1, ED2, ED3, and ED4 and the terminals 172 and 174. For example, the pads 126 may include element pads 130 and terminal pads 140.

The element pads 130 may be disposed on a center of each quadrant of the insulation layer 124. The respective diodes D and the respective transistors T, which constitute the first to fourth equivalent diode circuits ED1, ED2, ED3, and ED4, may be mounted on the element pads 130. The anode a and the cathode c of the diode D may be disposed in the third direction Z. The anode a may be disposed on a front surface of the diode D. The transistors T may be disposed on the element pads 130 to be adjacent to the diodes D. The source s, the drain d, and the gate g may be disposed on a front surface of the transistor T. Each of the element pads 130 may have a rectangular shape.

The terminal pads 140 may be disposed on an edge of the insulation layer 124. The terminal pads 140 may surround the element pads 130. The terminal pads 140 may extend between the first to fourth equivalent diode circuits ED1, ED2, ED3, and ED4. For example, the terminal pads 140 may include DC terminal pads 142 and AC terminal pads 146. Each of the DC terminal pads 142 may have a "T" shape. The DC terminal pads 142 may be connected to the DC terminals 172. The DC terminal pads 142 may include a cathode terminal pad 141 and an anode terminal pad 143. The cathode terminal pad 141 may be disposed at one side in the first direction X, and the anode terminal pad 143 may be disposed at the other side in the first direction X. Each of the AC terminal pads 146 may have a "T" shape.

The AC terminal pads 146 may be connected to the AC terminals 174. The AC terminal pads 146 may include a first AC terminal pad 145 and a second AC terminal pad 147. The first AC terminal pad 145 may be disposed at one side in the second direction Y, and the second AC terminal pad 147 may be disposed at the other side in the second direction Y. The first AC terminal pad 145 may be disposed between the first equivalent diode circuit ED1 and the fourth equivalent diode circuit ED4. The second AC terminal pad 147 may be disposed between the second equivalent diode circuit ED2 and the third equivalent diode circuit ED3.

The interconnection lines 150 may be disposed the diodes D, the transistors T, the element pads 130, and the terminal pads 140. For example, the interconnection lines 150 may include at least one of a bonding wire, a metal ribbon, a foil, or a clip. The solder 152 may be disposed between the interconnection lines 150 and the diodes D, between the interconnection lines 150 and the transistors T, between the interconnection lines 150 and the element pads 130, and between the interconnection lines 150 and the terminal pads 140. The solder 152 may include a bump, preform, or conductive epoxy. On the other hand, the solder 152 may be disposed between the terminal pads 140 and the terminals 172 and 174. On the other hand, the solder 152 may be disposed between the diodes D and the element pads 130 and between the transistors T and the element pads 130. The interconnection lines 150 may connect the diodes D and the transistors T to the element pads 130 and the terminal pads 140. When the interconnection lines 150 increase in length and complicated in loop or shape, parasitic inductance and surge current induced by the interconnection lines 150 may increase. The terminal pads 140 adjacent to the element pads 130 may reduce the length of each of the interconnection lines 150 or simplify the loop or shape of each of the interconnection lines, thereby reducing or minimizing the parasitic inductance and the surge current.

The molding layer 160 may be disposed on the substrate 120, the first to fourth equivalent diode circuits ED1, ED2, ED3, and ED4, and the interconnection lines 150. The molding layer 160 may cover the substrate 120, the first to fourth equivalent diode circuits ED1, ED2, ED3, and ED4, and the interconnection lines 150. The molding layer 160 may prevent breakdown of electrical insulation of the first to fourth equivalent diode circuits ED1, ED2, ED3, and ED4 and the interconnection lines 150 and minimize an influence of external environments. The molding layer 160 may include a polymer compound. The molding layer 160 may selectively expose a bottom surface of the supporter 110 to improve heat dissipation properties.

Figure 4A:
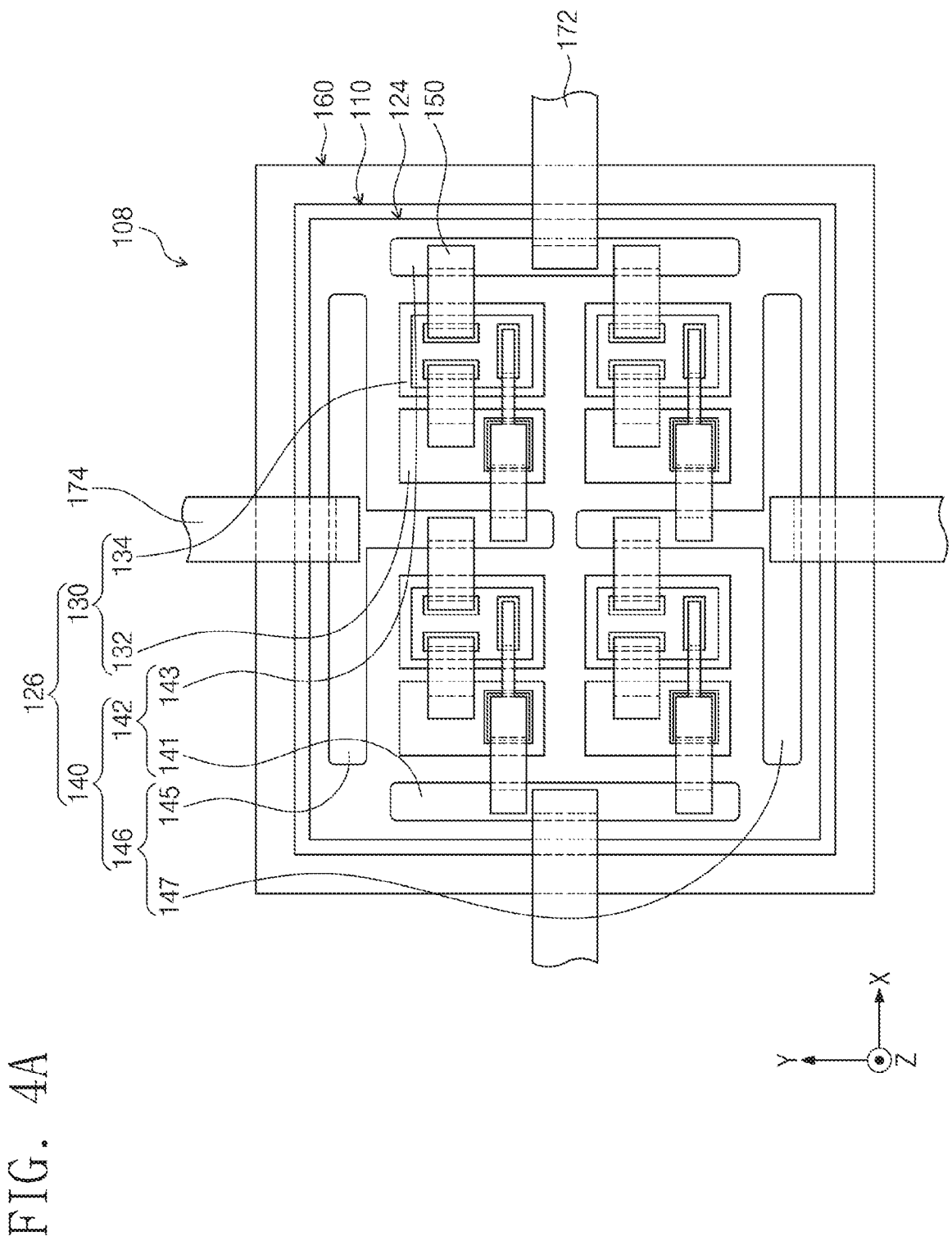
FIG. 4A is a plan view illustrating an example of the package of the high voltage bridge rectifier of FIG. 1.

FIG. 4A is a plan view illustrating an example of the package 108 of the high voltage bridge rectifier 104 of FIG. 1.

Referring to FIG. 4A, the package 108 of the bridge rectifier 104 according to the inventive concept may include a diode pad 132 and a transistor pad 134 of the element pads 130. A diode D may be mounted on the diode pad 132. A transistor T may be mounted on the transistor pad 134. The diode pad 132 and the transistor pad 134 may be separated from each other to electrically separate the diode D from the transistor T so that the diode D and the transistor T are separately mounted. Thus, when the diode D and the transistor T operate, a mutual electrical interference therebetween due to the structure of the semiconductor chip may be minimized.

A supporter 110, an insulation layer 124, terminal pads 140, first to fourth equivalent diode circuits ED1, ED2, ED3, and ED4, interconnection lines 150, a molding layer 160, DC terminals 172, and AC terminals 174 may be the same as those of FIG. 2.

Figure 4B:
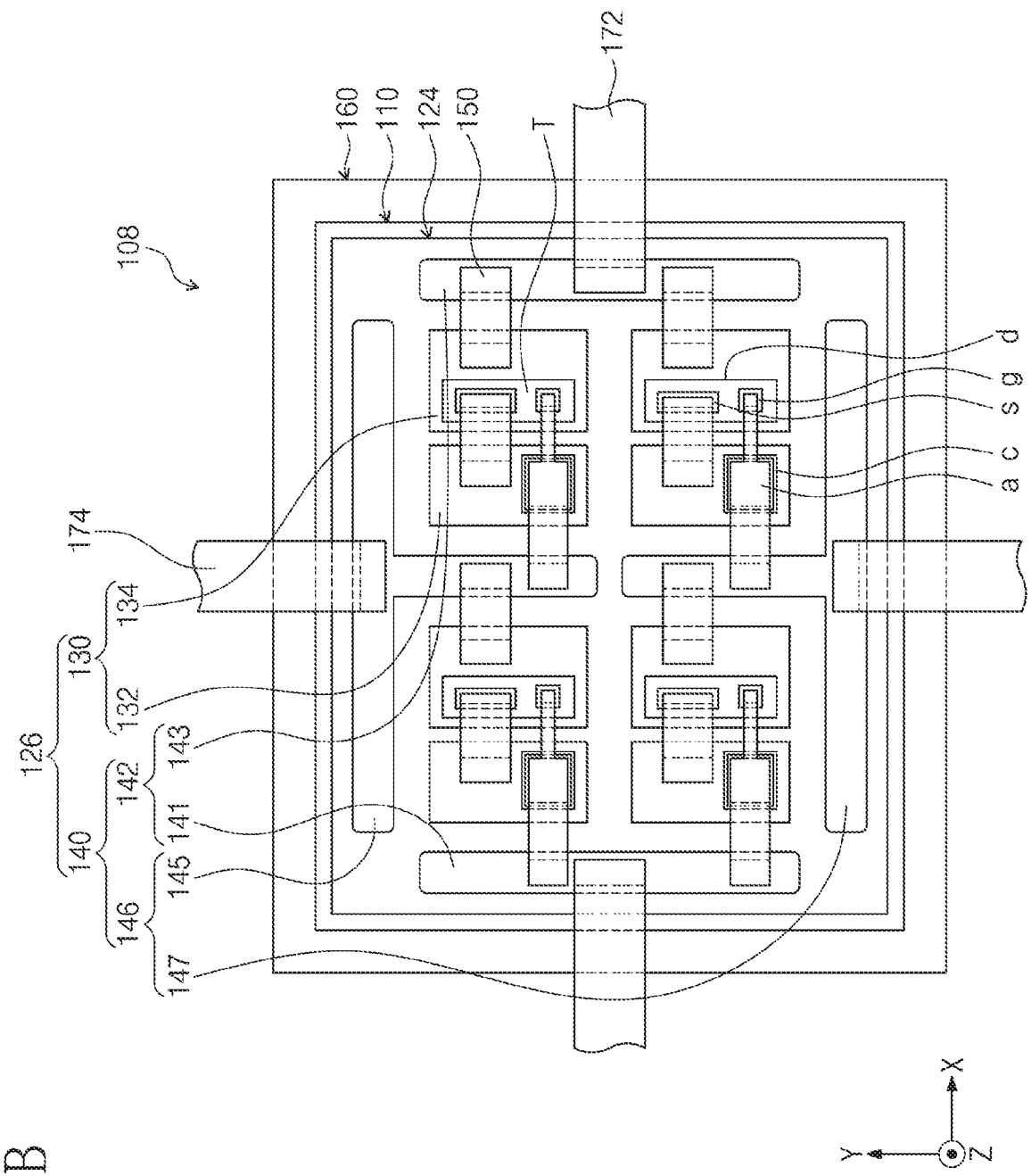
FIG. 4B is a plan view illustrating an example of the package of the high voltage bridge rectifier of FIG. 1.

FIG. 4B is a plan view illustrating an example of the package 108 of the high voltage bridge rectifier 104 of FIG. 1.

Referring to FIG. 4B, the package 108 of the bridge rectifier 104 according to the inventive concept may include a diode pad 132 and a transistor pad 134 of the element pads 130. A diode D may be mounted on the diode pad 132. A transistor T may be mounted on the transistor pad 134.

A source s, a gate g, and a drain d of the transistor T may be disposed in the third direction Z. The source s and the gate g may be disposed on a front surface of the transistor T. The drain d disposed on a rear surface of the transistor T may be connected to one of the DC terminal pads 142 and the AC terminal pads 146 through the interconnection line 150 connected to the transistor pad 134.

A supporter 110, an insulation layer 124, terminal pads 140, first to fourth equivalent diode circuits ED1, ED2, ED3, and ED4, a molding layer 160, DC terminals 172, and AC terminals 174 may be the same as those of FIG. 2.

Figure 5:
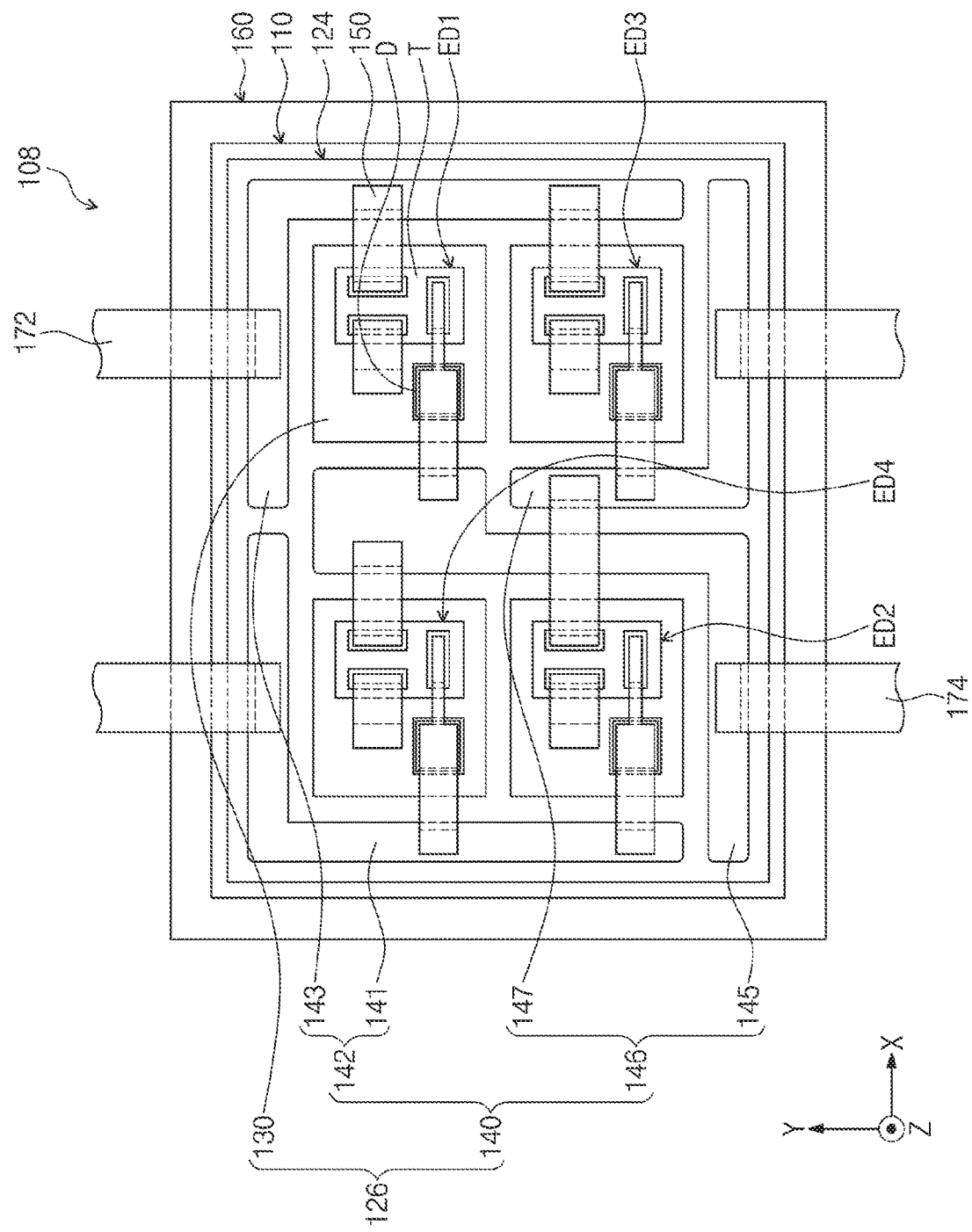
FIG. 5 is a plan view illustrating an example of the package of the high voltage bridge rectifier of FIG. 1.

FIG. 5 is a plan view illustrating an example of the package 108 of the high voltage bridge rectifier 104 of FIG. 1.

Referring to FIG. 5, each of terminal pads 140 of the package 108 of the high voltage bridge rectifier 104 may have an "L" shape. DC terminal pads 142 may be disposed at one side in the second direction Y and connected to DC terminals 172. AC terminal pads 146 may be disposed at the other side in the second direction Y and connected to AC terminals 174. The DC terminal pads 142 and the AC terminal pads 146 may improve convenience and stability of the connection of the DC terminals 172 and the AC terminals 174. The DC terminals 172 and the AC terminals 174 may extend in directions opposite to each other.

A supporter 110, an insulation layer 124, element pads 130, first to fourth equivalent diode circuits ED1, ED2, ED3, and ED4, interconnection lines 150, a molding layer 160 may be the same as those of FIG. 2.

Figure 6:
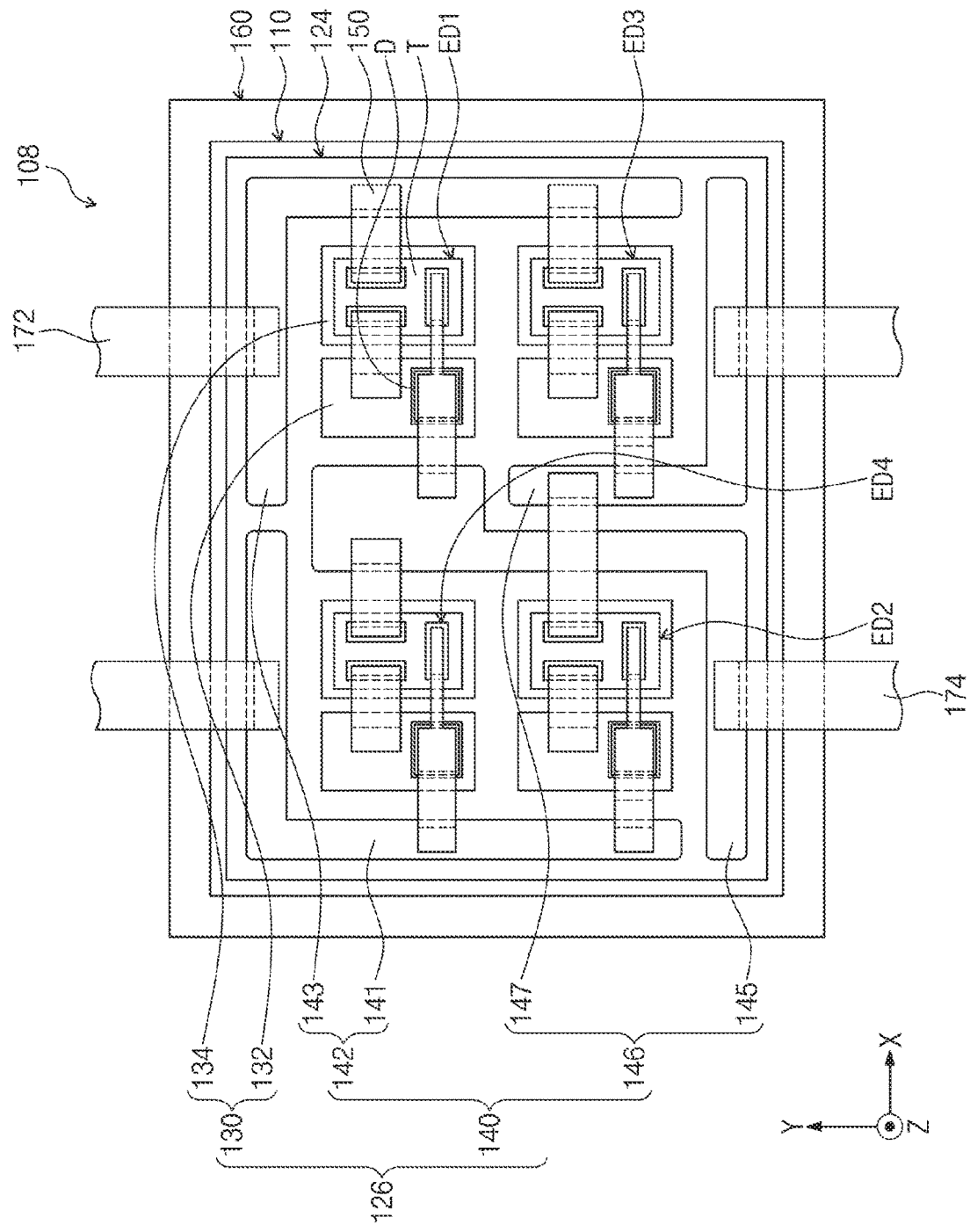
FIG. 6 is a plan view illustrating an example of the package of the high voltage bridge rectifier of FIG. 1.

FIG. 6 is a plan view illustrating an example of the package 108 of the high voltage bridge rectifier 104 of FIG. 1.

Referring to FIG. 6, the package 108 of the high voltage bridge rectifier 104 according to the inventive concept may include a diode pad 132 and a transistor pad 134 of the element pads 130. A diode D may be mounted on the diode pad 132. A transistor T may be mounted on the transistor pad 134. The diode pad 132 and the transistor pad 134 may be separated from each other to minimize a mutual electrical interference between the diode D and the transistor T.

A supporter 110, an insulation layer 124, terminal pads 140, first to fourth equivalent diode circuits ED1, ED2, ED3, and ED4, interconnection lines 150, a molding layer 160, DC terminals 172, and AC terminals 174 may be the same as those of FIG. 5.

Figure 7:
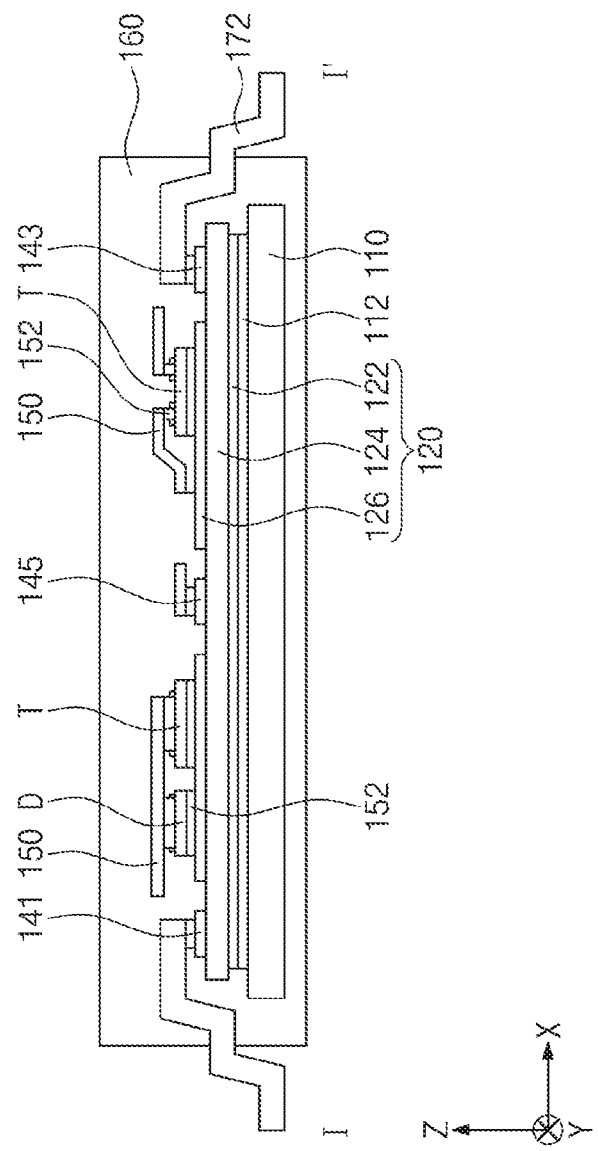
FIG. 7 is a cross-sectional view illustrating an example of a molding layer of FIG. 2.

FIG. 7 is a cross-sectional view illustrating an example of the molding layer 160 of FIG. 2.

Referring to FIG. 7, a molding layer 160 of the package 108 of the high voltage bridge rectifier 104 may cover entire surfaces of the supporter 110, the substrate 120, the first to fourth equivalent diode circuits ED1, ED2, ED3, and ED4, and the interconnection lines 150 to protect the supporter 110, the substrate 120, the first to fourth equivalent diode circuits ED1, ED2, ED3, and ED4, and the interconnection lines 150. The molding layer 160 may be disposed on a bottom surface of the supporter 110 to provide mechanical robustness.

Figure 8:
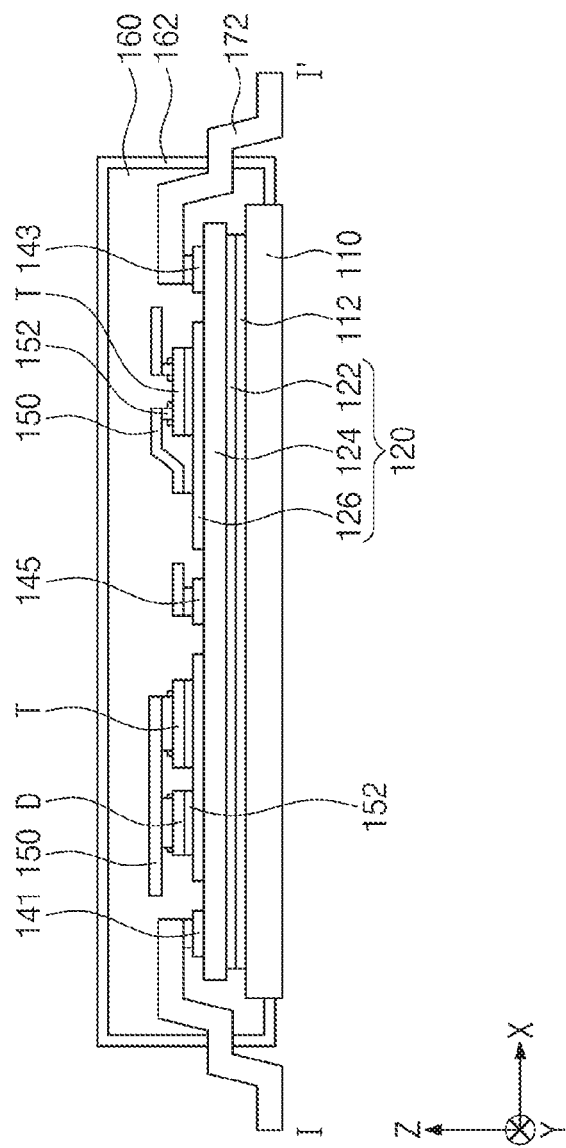
FIG. 8 is a cross-sectional view taken along line I-I' of FIG. 2.

FIG. 8 is a cross-sectional view taken along line I-I' of FIG. 2.

Referring to FIG. 8, the package 108 of the high voltage bridge rectifier 104 may include a molding case 162. The molding case 162 may be disposed on a molding layer 160. The molding case 162 may protect the molding layer 160. The molding case 162 may include plastic. The molding layer 160 may include a silicone-based gel-type insulation filler. The molding layer 160 may be cured by external heat. The molding layer 160 may minimize damage due to mismatch in thermal expansion coefficient between the supporter 110, the substrate 120, the diodes D, the transistors T, the interconnection lines 150, and the terminals 172 and 174.

The supporter 110, the substrate 120, the first to fourth equivalent diode circuits ED1, ED2, ED3, and ED4, and the interconnection lines 150 may be the same as those of FIG. 3.

Figure 9:
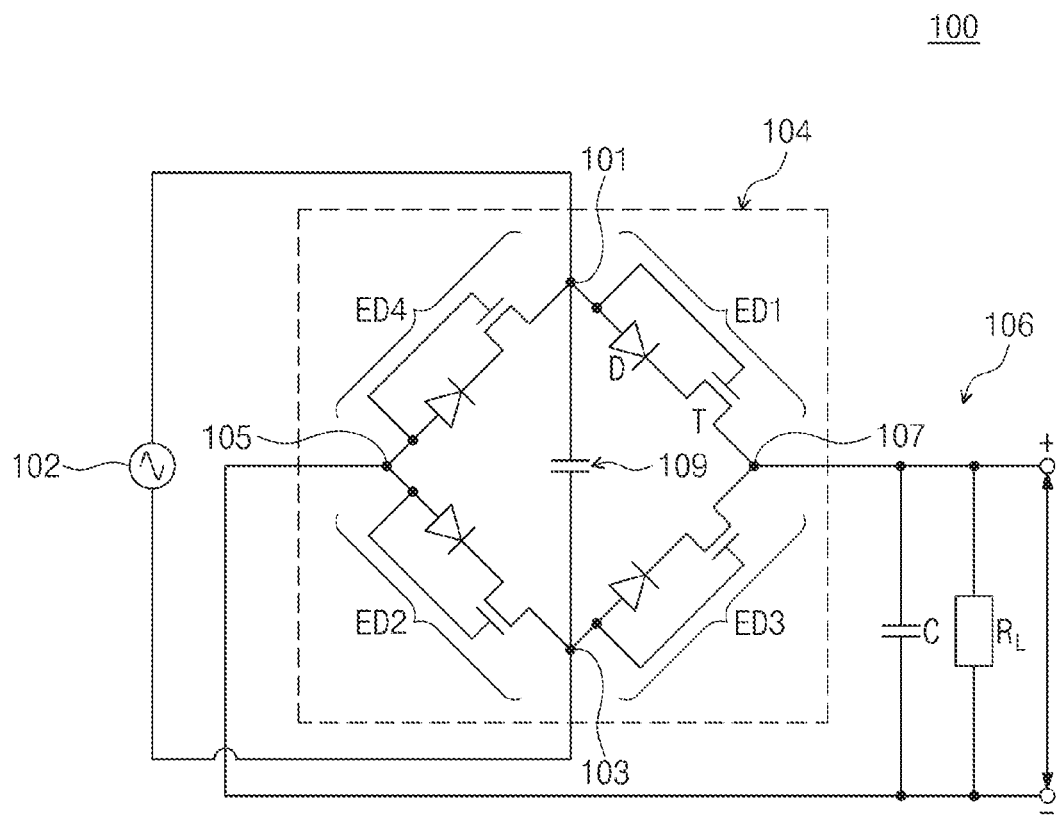
FIG. 9 is a circuit diagram of a power conversion device according to the inventive concept.

FIG. 9 is a circuit diagram of a power conversion device 100 according to the inventive concept.

Referring to FIG. 9, the high voltage bridge rectifier 104 of the power conversion device 100 according to the inventive concept may include an EMI filter 109. The EMI filter 109 may be connected between a first AC node 101 and a second AC node 103. The EMI filter 109 may include a capacitor. The EMI filter 109 may remove EMI noise.

Figure 10:
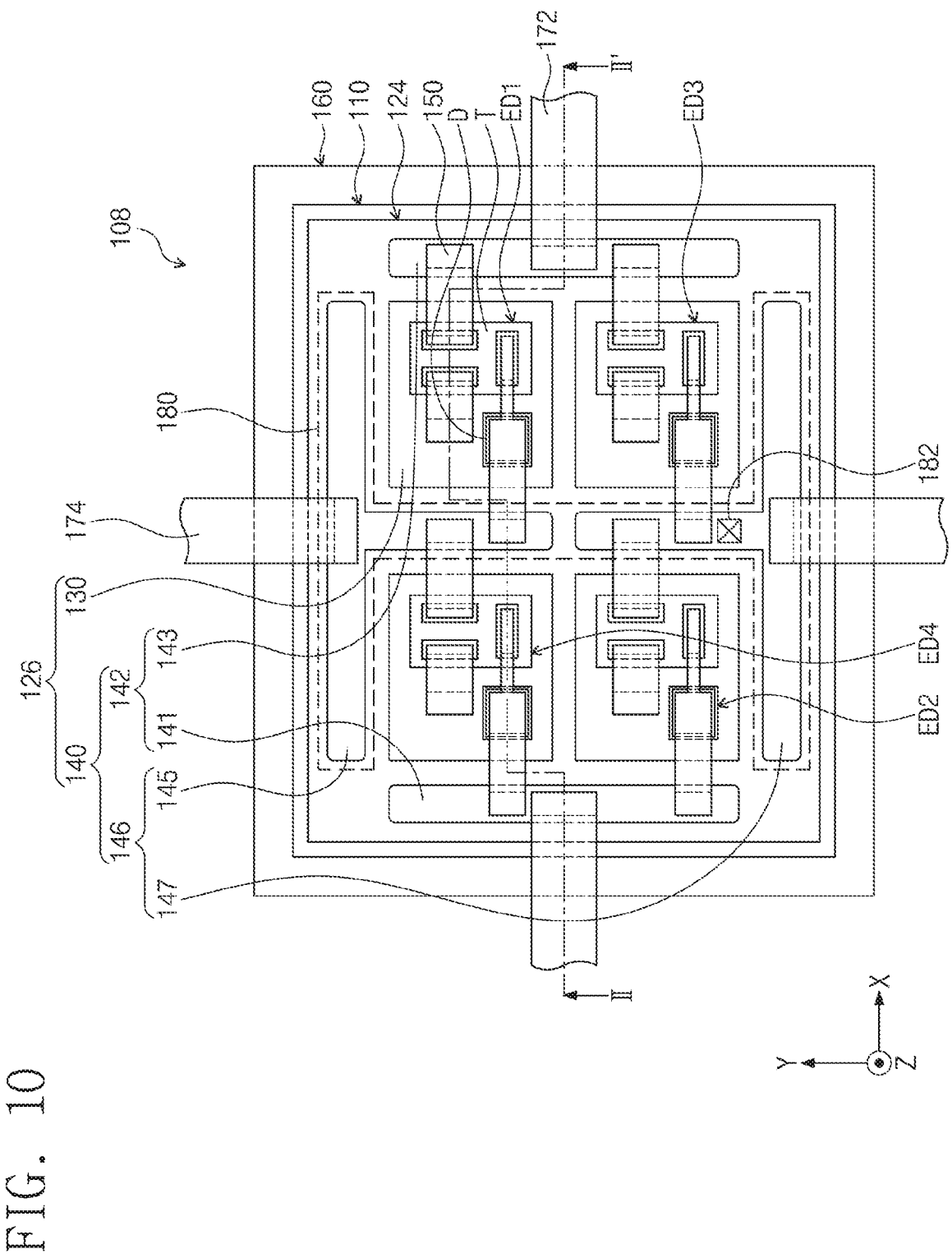
FIG. 10 is a plan view illustrating an example of a package of a high voltage bridge rectifier of FIG. 9.
Figure 11:
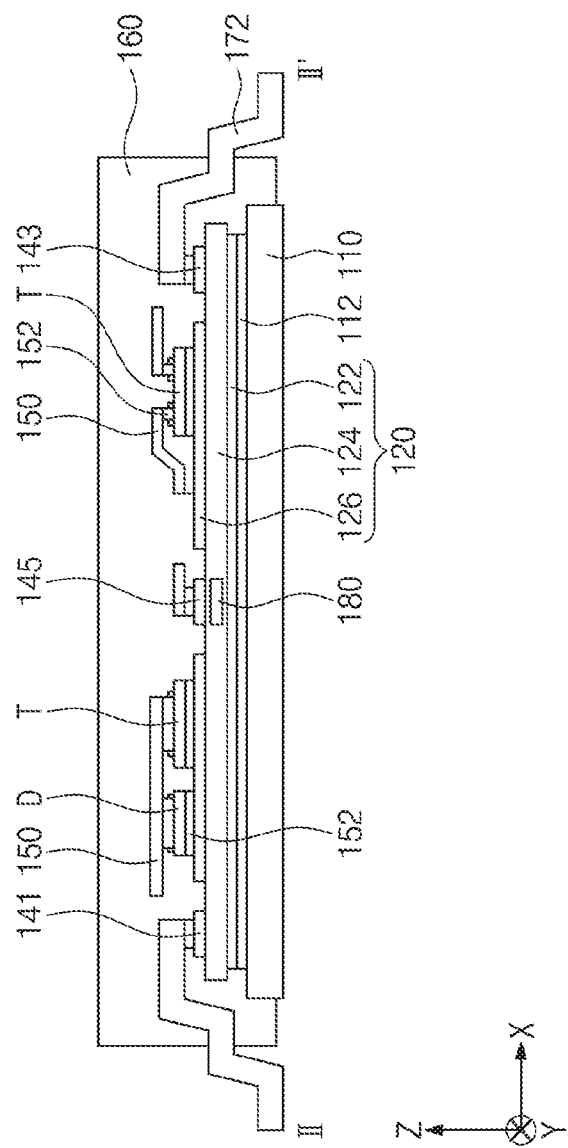
FIG. 11 is a cross-sectional view taken along line II-II' of FIG. 10.

FIG. 10 is a plan view illustrating an example of the package 108 of the high voltage bridge rectifier 104 of FIG. 9. FIG. 11 is a cross-sectional view taken along line II-II' of FIG. 10.

Referring to FIGS. 10 and 11, the package 108 of the high voltage bridge rectifier 104 may include a capacitor electrode 180 and a contact electrode 182. A supporter 110, a substrate 120, first to fourth equivalent diode circuits ED1, ED2, ED3, and ED4, interconnection lines 160, and a molding layer 160 may be the same as those of FIGS. 2 and 3.

The capacitor electrode 180 may be disposed within an insulation layer 124 of the substrate 120. The capacitor electrode 180 may be aligned with AC terminal pads 146. Each of the AC terminal pads 146 may have a "T" shape, and the capacitor electrode 180 may have an "H" shape.

The contact-electrode 182 may selectively connect one of the first AC terminal pad 145 and the second AC terminal pad 147 to the capacitor electrode 180. When the contact electrode 182 connects the second AC terminal pad 147 to the capacitor electrode 180, the capacitor electrode 180 may be electrically separated from the first AC terminal pad 145. The capacitor electrode 180 may act or serve as the EMI filter 109 while having capacitance from the first AC terminal pad 145. The capacitance is inversely proportional to a distance between the first AC terminal pad 145 and the capacitor electrode 180 and may be proportional to a dielectric constant of the insulation layer 124. Also, the capacitance may be proportional to an area of each of the first AC terminal pad 145 and the capacitor electrode 180. When the contact electrode 182 connects the first AC terminal pad 145 to the capacitor electrode 180, the capacitor electrode 180 may act or serve as the EMI filter 109 while having capacitance from the second AC terminal pad 147.

Figure 12:
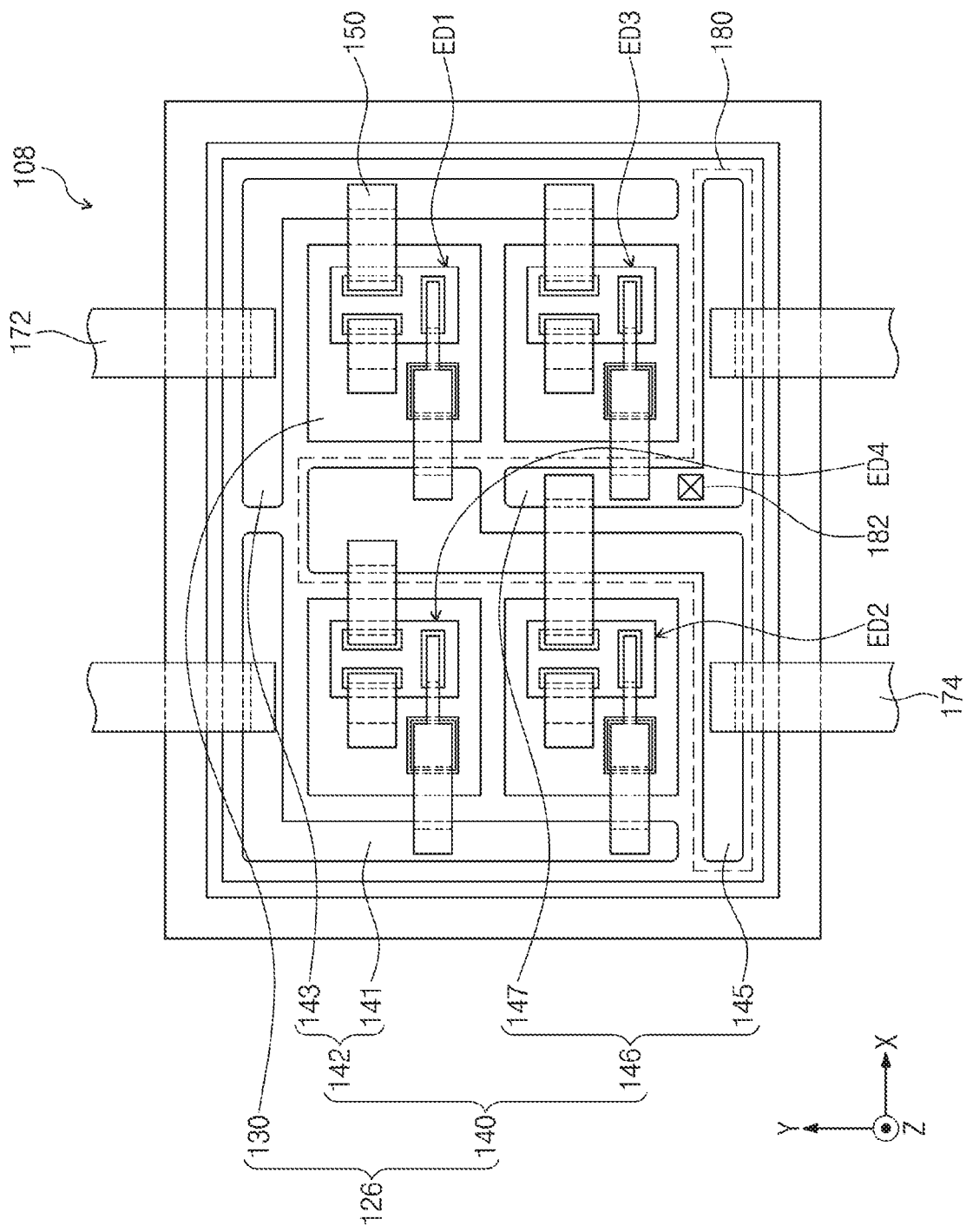
FIG. 12 is a plan view illustrating an example of the package of the high voltage bridge rectifier of FIG. 9.

FIG. 12 is a plan view illustrating an example of the package 108 of the high voltage bridge rectifier 104 of FIG. 9.

Referring to FIG. 12, each of the terminal pads 140 of the package 108 of the high voltage bridge rectifier 104 may have an "L" shape, and the capacitor electrode 180 may have a "T" shape. The capacitor electrode 180 may be aligned with the terminal pads 140. The contact electrode 182 may connect the second AC terminal pad 147 to the capacitor electrode 180. The capacitor electrode 180 may have capacitance from the first AC terminal pad 145 and act or serve as the EMI filter 109.

A supporter 110, a substrate 120, first to fourth equivalent diode circuits ED1, ED2, ED3, and ED4, interconnection lines 160, and a molding layer 160 may be the same as those of FIGS. 2 and 10.

Figure 13:
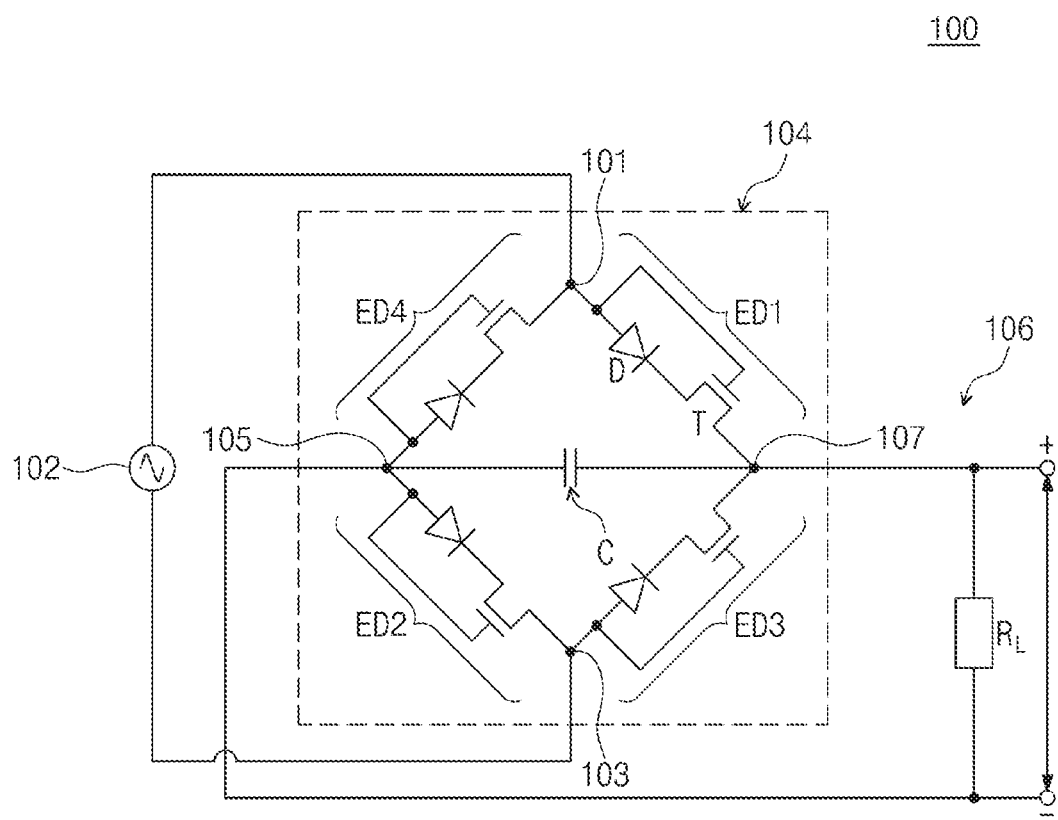
FIG. 13 is a circuit diagram of a power conversion device according to the inventive concept.

FIG. 13 is a circuit diagram of a power conversion device 100 according to the inventive concept.

Referring to FIG. 13, the high voltage bridge rectifier 104 of the power conversion device 100 according to the inventive concept may include a full-wave rectification circuit 106 and a capacitor C. The capacitor C may be connected between an anode 107 and a cathode 105. The capacitor C may smooth out a rectified output waveform or minimize or remove an electromagnetic interference (EMI) of induced by a load resistor $R_L$.

Figure 14:
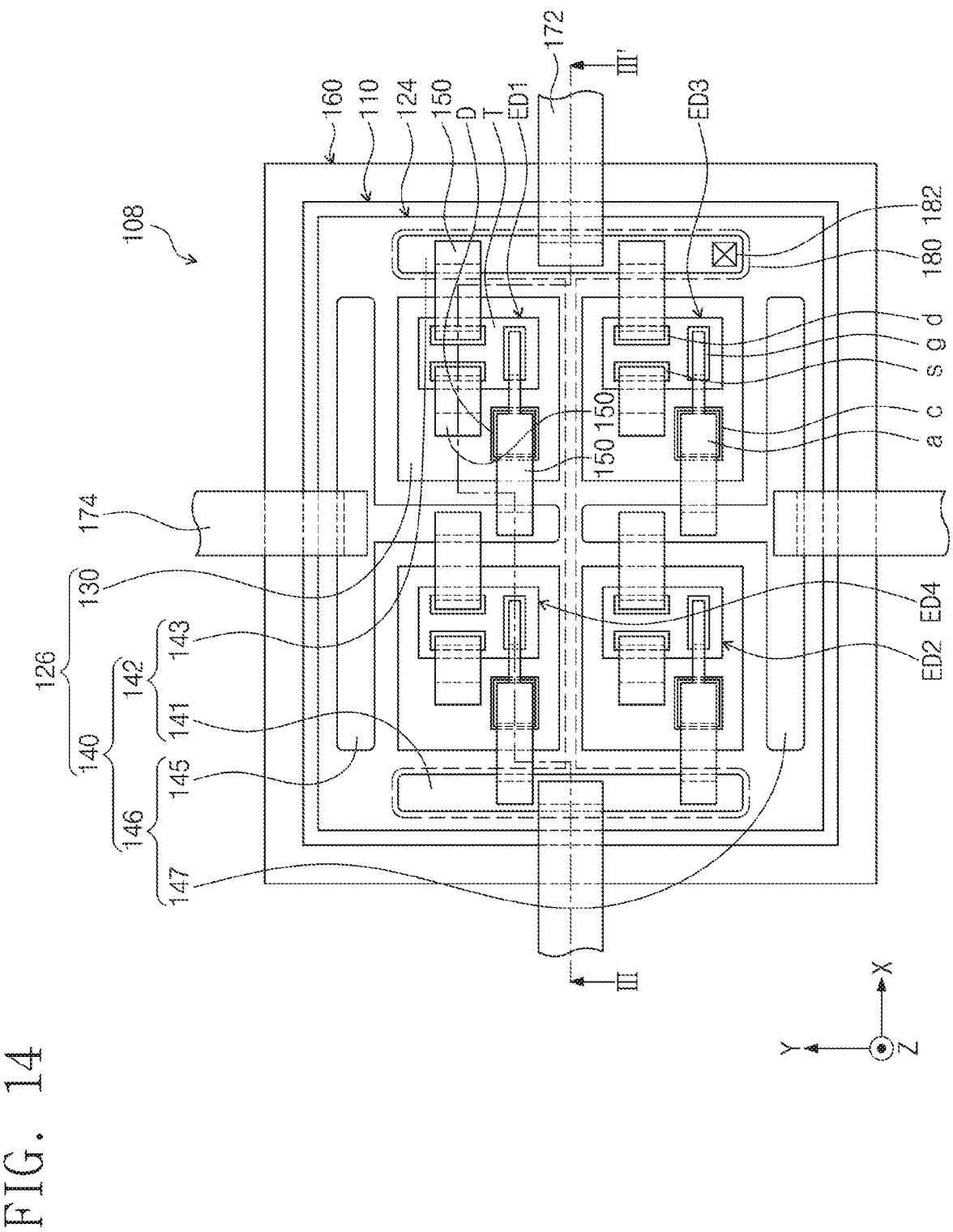
FIG. 14 is a plan view illustrating an example of the package of the high voltage bridge rectifier of FIG. 13.
Figure 15:
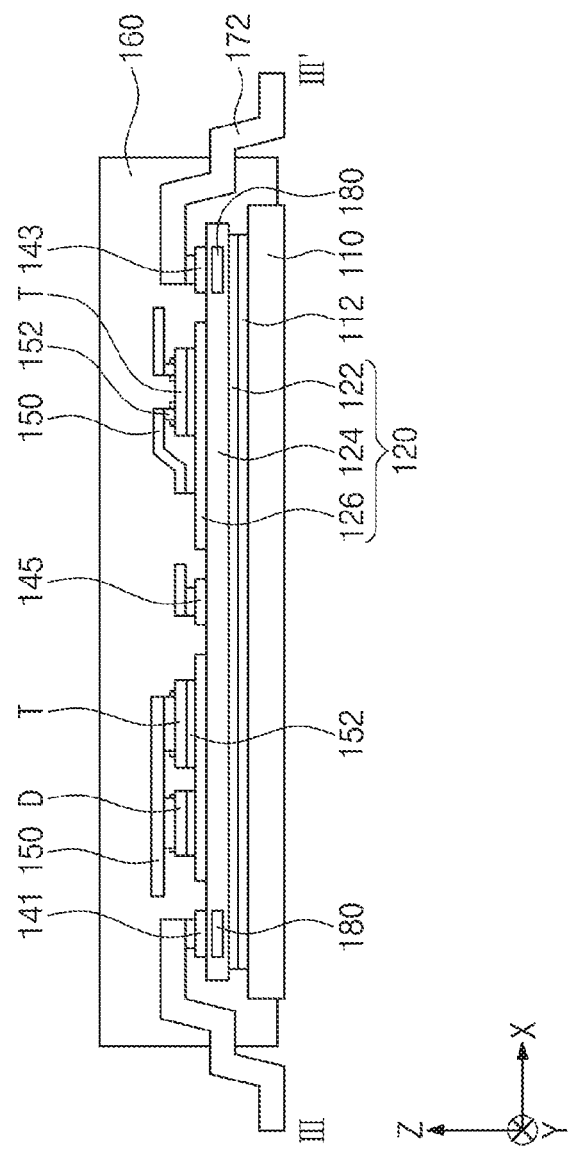
FIG. 15 is a cross-sectional view taken along line III-III' of FIG. 14.

FIG. 14 is a plan view illustrating an example of the package 108 of the high voltage bridge rectifier 104 of FIG. 13. FIG. 15 is a cross-sectional view taken along line III-III' of FIG. 14.

Referring to FIGS. 14 and 15, the package 108 of the high voltage bridge rectifier 104 may include a capacitor electrode 180 and a contact electrode 182. A supporter 110, a substrate 120, first to fourth equivalent diode circuits ED1, ED2, ED3, and ED4, interconnection lines 160, and a molding layer 160 may be the same as those of FIGS. 2 and 3.

The capacitor electrode 180 may be disposed within an insulation layer 124 of the substrate 120. The capacitor electrode 180 may be aligned with DC terminal pads 142. Each of the DC terminal pads 142 may have an "I" shape, and the capacitor electrode 180 may have an "H" shape.

The contact electrode 182 may selectively connect one of a cathode terminal pad 141 and an anode terminal pad 143 to the capacitor electrode 180. When the contact electrode 182 connects the anode terminal pad 143 to the capacitor electrode 180, the capacitor electrode 180 may be electrically separated from the cathode terminal pad 141. The capacitor electrode 180 may act or serve as the capacitor C while having capacitance from the cathode terminal pad 141. The capacitance is inversely proportional to a distance between the cathode terminal pad 141 and the capacitor electrode 180 and may be proportional to a dielectric constant of the insulation layer 124. Also, the capacitance may be proportional to an area of each of the cathode terminal pad 141 and the capacitor electrode 180. When the contact electrode 182 connects the cathode terminal pad 141 to the capacitor electrode 180, the capacitor electrode 180 may act or serve as the capacitor C while having capacitance from the anode terminal pad 143.

Figure 16:
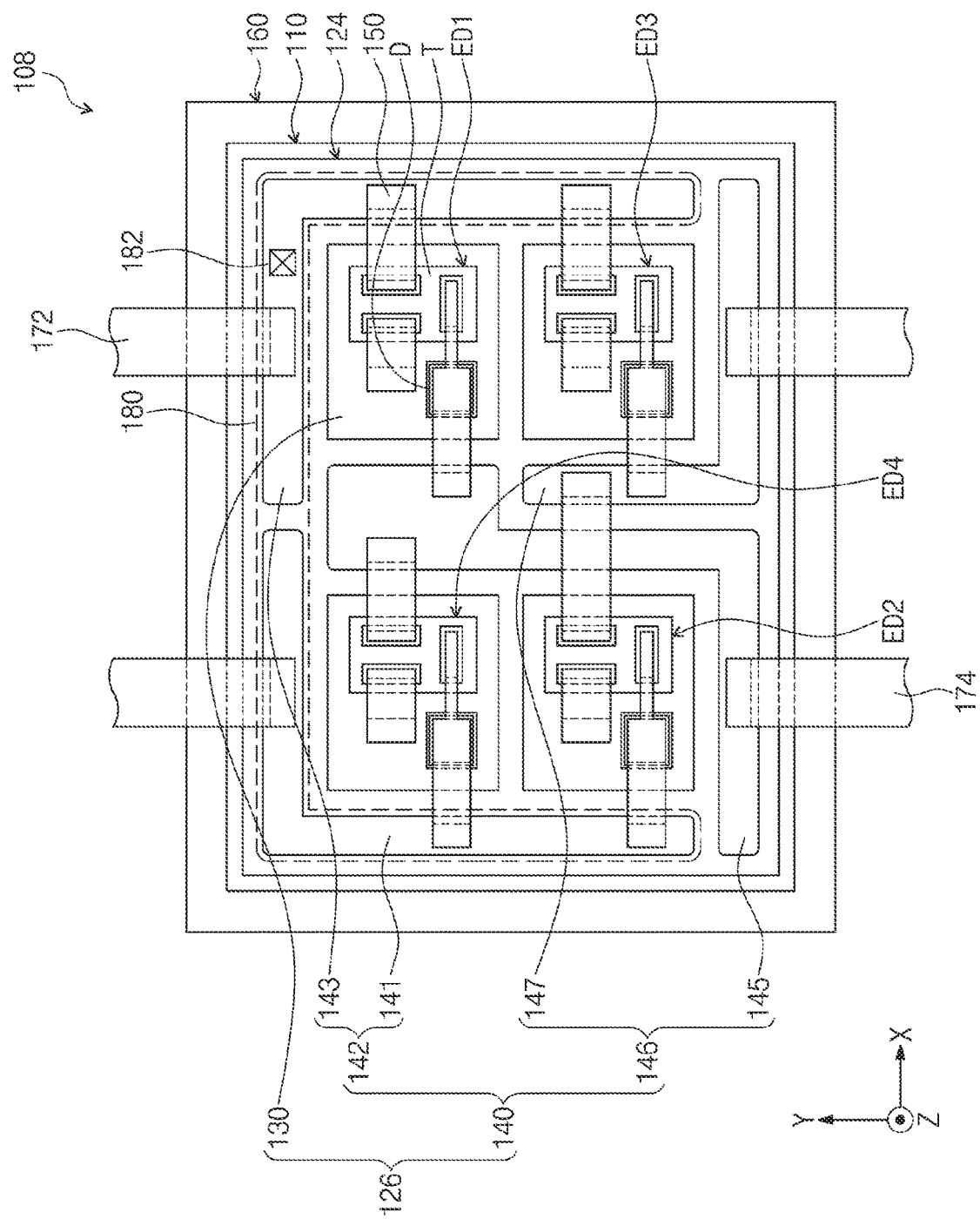
FIG. 16 is a plan view illustrating an example of a package of a high voltage bridge rectifier of FIG. 13.

FIG. 16 is a plan view illustrating an example of the package 108 of the high voltage bridge rectifier 104 of FIG. 13.

Referring to FIG. 16, each of the terminal pads 140 of the package 108 of the high voltage bridge rectifier 104 may have an "L" shape, and the capacitor electrode 180 may have a "⊏" shape. The capacitor electrode 180 may be aligned with the terminal pads 140. The contact electrode 182 may connect the anode terminal pad 143 to the capacitor electrode 180. The capacitor electrode 180 may have capacitance from the cathode terminal pad 141 and act or serve as the capacitor C.

A supporter 110, a substrate 120, first to fourth equivalent diode circuits ED1, ED2, ED3, and ED4, interconnection lines 160, and a molding layer 160 may be the same as those of FIGS. 2, 10, and 14.

As described above, in the package of the high voltage bridge rectifier, the plurality of equivalent diode circuits may be efficiently disposed and mounted on the element pad, and the terminal pads may be disposed on the edge of the substrate insulation layer. These arrangements may be used to reduce the lengths of the interconnection lines connected to the element pads on the center of the insulation layer and the diodes and transistors on the element pads and simplify the loops or shapes of the interconnection lines, thereby minimizing the parasitic inductance and the surge current and also minimizing the size of the package.

Although the embodiment of the inventive concept is described with reference to the accompanying drawings, those with ordinary skill in the technical field of the inventive concept pertains will be understood that the present disclosure can be carried out in other specific forms without changing the technical idea or essential features. Thus, the above-disclosed embodiments are to be considered illustrative and not restrictive.

What is claimed is:

1. A high voltage bridge rectifier comprising:
   a supporter;
   a substrate on the supporter; and
   a plurality of equivalent diode circuits mounted on the substrate,
   wherein the substrate comprises:
   an insulation layer;
   element pads disposed on a center of the insulation layer and under the plurality of equivalent diode circuits; and
   terminal pads disposed on an edge of the insulation layer and surrounding the element pads.

2. The high voltage bridge rectifier of claim 1, wherein each of the plurality of equivalent diode circuits comprises:
   a diode; and
   a high voltage normally-on type transistor including a source connected to a cathode of the low voltage diode, a gate connected to an anode of the low voltage diode, and a drain connected in series to the source.

3. The high voltage bridge rectifier of claim 2, wherein each of the element pads comprises:
   a diode pad on which the diode is mounted; and
   a transistor pad on which the transistor is mounted.

4. The high voltage bridge rectifier of claim 1, wherein the terminal pads comprise:
   DC terminal pads disposed to be spaced apart from each other on the insulation layer in a first direction; and
   AC terminal pads disposed to be spaced apart from each other on the insulation layer in a second direction crossing the first direction.

5. The high voltage bridge rectifier of claim 4, wherein the DC terminal pads comprise:
   a cathode terminal pad disposed at one side in the first direction; and
   an anode terminal pad disposed on the other side in the first direction.

6. The high voltage bridge rectifier of claim 5, wherein each of the cathode terminal pad and the anode terminal pad has an "I" shape.

7. The high voltage bridge rectifier of claim 5, wherein each of the cathode terminal pad and the anode terminal pad has an "L" shape.

8. The high voltage bridge rectifier of claim 4, wherein the AC terminal pads comprise:
   a first AC terminal pad disposed at one side in the second direction; and
   a second AC terminal pad disposed at the other side in the second direction.

9. The high voltage bridge rectifier of claim 8, further comprising a capacitor electrode disposed within the insulation layer and aligned with the first and second AC terminal pads.

10. The high voltage bridge rectifier of claim 9, wherein each of the first AC terminal pad and the second AC terminal pad has a "T" shape, and
    the capacitor electrode has an "H" shape.

11. The high voltage bridge rectifier of claim 9, wherein each of the first AC terminal pad and the second AC terminal pad has an "L" shape, and
    the capacitor electrode has a "T" shape.

12. The high voltage bridge rectifier of claim 9, further comprising a contact electrode configured to selectively connect the capacitor electrode to one of the first AC terminal pad and the second AC terminal pad.

13. The high voltage bridge rectifier of claim 1, further comprising a molding layer on the substrate and the plurality of equivalent diode circuits,
  wherein the molding layer selectively exposes a bottom surface of the supporter.

14. The high voltage bridge rectifier of claim 13, further comprising a molding case configured to surround the molding layer.

* * * * *